(12) United States Patent
Lim et al.

(10) Patent No.: US 6,483,373 B1
(45) Date of Patent: Nov. 19, 2002

(54) INPUT CIRCUIT HAVING SIGNATURE CIRCUITS IN PARALLEL IN SEMICONDUCTOR DEVICE

(75) Inventors: Jong-hyoung Lim, Suwon (KR); Sang-seok Kang, Suwon (KR); Hyun-seok Lee, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 119 days.

(21) Appl. No.: 09/670,740

(22) Filed: Sep. 27, 2000

(30) Foreign Application Priority Data

Sep. 27, 1999 (KR) .............................. 99-41314

(51) Int. Cl.$^7$ .............................................. H01H 37/76
(52) U.S. Cl. ........................................ 327/525; 327/526
(58) Field of Search ................................ 327/320, 325, 327/525, 526

(56) References Cited

U.S. PATENT DOCUMENTS

| | | | | |
|---|---|---|---|---|
| 4,689,494 A | * | 8/1987 | Chen et al. ................... 326/13 |
| 5,838,189 A | * | 11/1998 | Jeon ............................ 327/525 |
| 5,907,513 A | * | 5/1999 | Kato ............................ 326/38 |
| 6,037,799 A | * | 3/2000 | McClure et al. .............. 326/37 |
| 6,198,337 B1 | * | 3/2001 | Matsuura ..................... 327/513 |
| 6,198,338 B1 | * | 3/2001 | Han et al. .................... 327/525 |
| 6,232,823 B1 | * | 5/2001 | Tsuchida ..................... 327/525 |
| 6,310,506 B1 | * | 10/2001 | Brown ......................... 327/276 |
| 6,329,863 B1 | * | 12/2001 | Lee et al. .................... 327/309 |

* cited by examiner

Primary Examiner—Terry D. Cunningham
(74) Attorney, Agent, or Firm—F. Chau & Associates, LLP (57) ABSTRACT

An input circuit having one or more individual signature circuits connected in parallel between an input line and an voltage node in a semiconductor device and an individual signature circuit are provided. The individual signature circuits are isolated from an input/output port to which a high frequency signal is applied so that the input/output port of the semiconductor device can operate at high speed. The signature circuits are provided for an input/output port to which a relatively low frequency signal is applied. An individual signature circuit includes an indexer and a selector connected in series between the voltage node and the input line. The selector includes two terminals which are electrically short-circuited or snapped in response to a control signal, and the indexer includes one or more voltage reducing devices connected in series between input and output terminals of the indexer and signature fuses each of which is connected in parallel to corresponding one of the voltage reducing devices. Voltage drop in the indexer varies with a combination of the signature fuses which are cut or uncut. By varying a voltage drop of an indexer in each of the individual signature circuits, a number of indexes are obtained to index various kinds of information of a semiconductor device.

30 Claims, 12 Drawing Sheets

INPUT CIRCUIT HAVING SIGNATURE CIRCUITS IN PARALLEL IN SEMICONDUCTOR DEVICE

BACKGROUND OF THE INVENTION

1. Field of the Invention

The present invention relates to a semiconductor device, and more particularly, to an input circuit having signature circuits arranged in parallel in a semiconductor device.

2. Description of the Related Art

Signature circuits are used for various purposes, for example, for marking defective products during a packaging process and for identifying products to avoid various products from being confused with each other.

In semiconductor products which interface at low frequencies, the low frequency characteristics of an input/output port are rarely considered. However, recently developed semiconductor products operate at high frequencies or speed. One skilled in the art can appreciate that high speed electronic interfacing exhibits different and often distorting characteristics. Accordingly, it is necessary that the semiconductor products operating at high speed are equipped with input/output ports that can handle operation in high frequency interfacing correctly, for example, at several hundred MHZ. One problem in high speed operation is the varying impedance of an input/output of a semiconductor-product in high speed interfacing. Various technical approaches have been proposed to reduce the problems associated with the impedance of an input/output port of a semiconductor product.

The impedance characteristics of an input port depends on the resistance of internal signal lines connected to the input port, inductance, parasitic capacitance and the capacitance of an input buffer. Moreover, circuits (such as static electricity dischargers, waveform clamping circuits and connection test diodes) connected to or accompanied with the input port and parasitic capacitance of a signature circuit for indexing a semiconductor product affects the impedance characteristics of the input port, typically by increasing its resistance.

Figure 1:
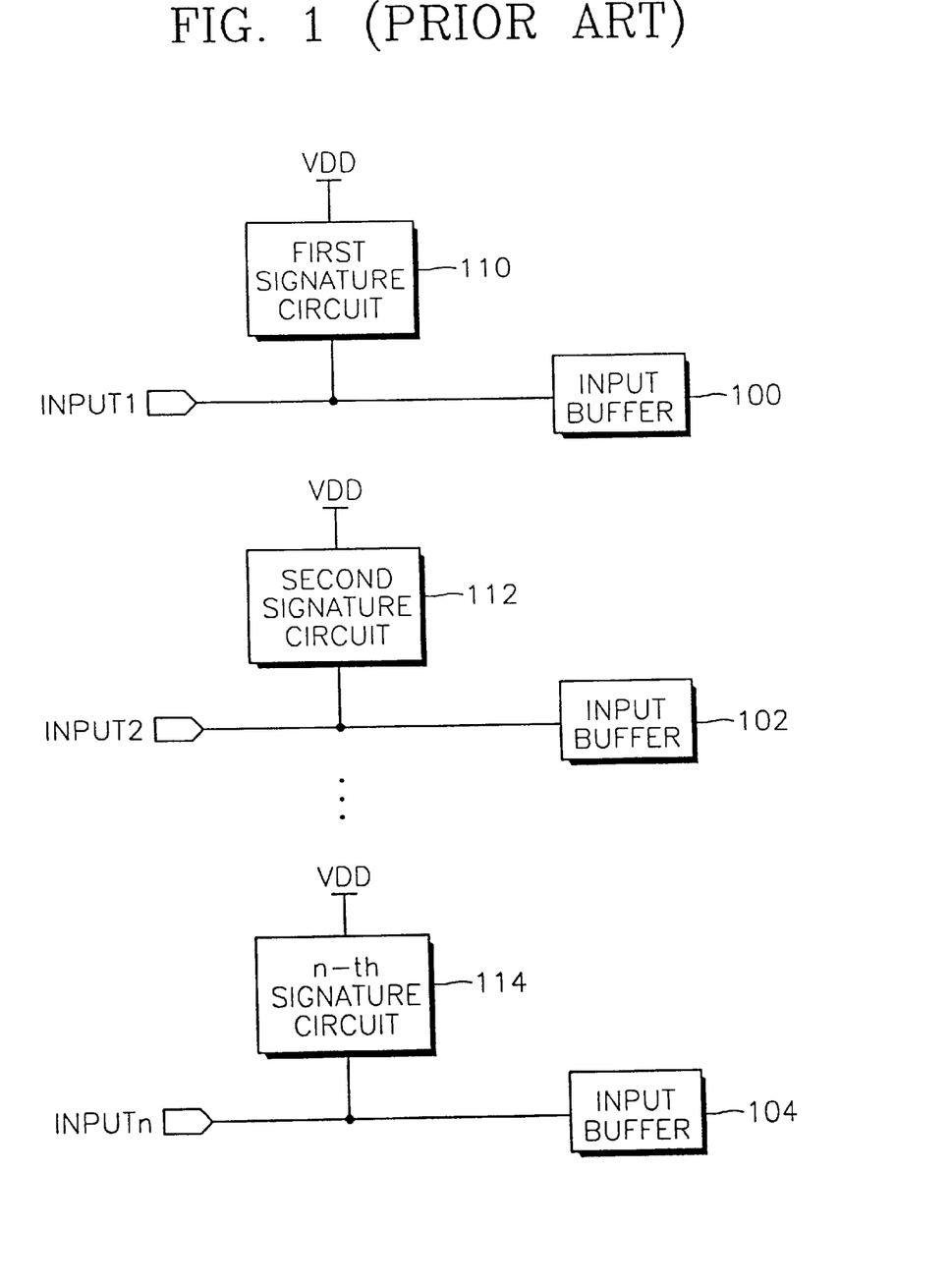
FIG. 1 is a diagram illustrating a conventional input circuit in a semiconductor device.

FIG. 1 is a diagram illustrating a conventional input circuit. In the conventional input circuit, first, second and n-th signature circuits 110, 112 and 114 are provided for respective input buffers 100,102 and 104 to obtain a large number of indexes. Each of the signature circuits 110,112 and 114 includes fuses (e.g., F20 in FIG. 2), and whether the fuses are cut or not determines whether current flows in each of the signature circuits 110,112 and 114.

Figure 2:
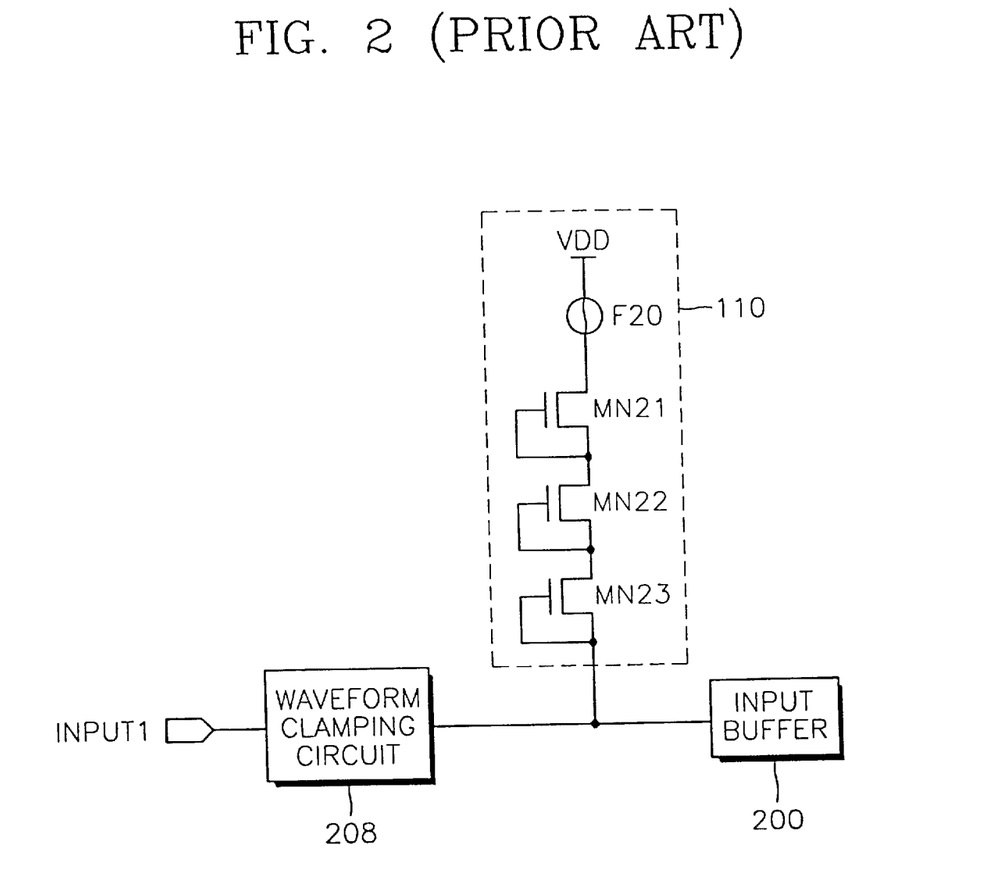
FIG. 2 is a diagram illustrating an individual signature circuit of the input circuit of FIG. 1.

FIG. 2 is a diagram illustrating an individual signature circuit of the input circuit of FIG. 1. The individual signature circuit includes a master fuse F20 and NMOS transistors MN21, MN22 and MN23. Each of the NMOS transistors MN21, MN22 and MN23 has a gate and a source, which are connected to each other, and operates as a diode. The NMOS transistors MN21, MN22 and MN23 are connected in series. A waveform clamping circuit 208 is provided between an input port INPUT1 and an input buffer 200 to compensate for waveform of an input signal applied to the input buffer 200.

Information stored in the individual signature circuit 110 is obtained by detecting a voltage of the input port at which current flows in the individual signature circuit while varying the voltage of the input port. If the master fuse F20 is not cut, current flows in the signature circuit 110 when the voltage of the input port is higher than a power supply voltage VDD by the sum of the threshold voltages of the NMOS transistors MN21, MN22 and MN23. Various kinds of information on a packaged semiconductor device are represented by a combination of fuses of signature circuits which are cut or uncut.

The impedance of an input/output port having the individual signature circuit 110 includes parasitic capacitance such as gate overlap capacitance and junction capacitance of the NMOS transistor MN23. The parasitic capacitance of the individual signature circuit 110 causes parasitic effects when the associated input port is interfaced at high speed.

Consequently, signature circuits are typically used with input/output ports interfacing at low speed. Accordingly, conventional input circuits in a semiconductor device having signature circuits have limited number of available indexes due to high impedance at high speed interfacing.

Moreover, a conventional individual signature circuit cannot be used together with the waveform clamping circuit 208. The waveform clamping circuit 208 is used for compensating for the waveform of an input signal within a predetermined range and is normally applied to an input device in a semiconductor device. Usual waveform clamping circuits clamp a signal of a voltage higher than an external power supply voltage VDD by 1 VT (VT is the threshold voltage of a transistor in a waveform clamping circuit) and a signal of a voltage lower than an external ground voltage VSS by 1 VT. For example, when a voltage higher than the external power supply voltage VDD by 1 VT is applied to the input port INPUT1, a transistor of the waveform clamping circuit 208 is turned on, and current is diverted to the waveform clamping circuit. Consequently, the current flowing in the individual signature circuit 110 cannot be detected.

Therefore, a need exists for a signature circuit which can decrease the impedance of an input/output port and can be used together with a waveform clamping circuit in a semiconductor device.

SUMMARY OF THE INVENTION

To solve the above problems, it is an object of the present invention to provide an input circuit in a semiconductor device for obtaining a large number of indexes and capable of interfacing at high frequency.

It is another object of the present invention to provide a signature circuit which can be used together with a waveform clamping circuit provided for an input port in a semiconductor device.

Accordingly, to achieve the above and other objects of the invention, there is provided an individual signature circuit in a semiconductor device having an input line for propagating a signal applied from an input port to an input buffer. Two or more individual signature circuits are connected in parallel between the input line and a predetermined voltage node and selectively enabled in response to a predetermined control signal. An individual signature circuit includes an indexer and a selector connected in series between the voltage node and the input line.

Preferably, two terminals of the selector are electrically short-circuited or snapped in response to the control signal, and the indexer includes one or more voltage reducing devices connected in series between input and output terminals of the indexer and signature fuses each of which is connected in parallel to corresponding one of the voltage reducing devices. Therefore, voltage drop in the indexer varies with a combination of the signature fuses which are cut or uncut.

Preferably, the indexer may include one or more variable resistors connected in series between input and output terminals of the indexer and signature fuses each of which is connected in parallel to corresponding one of the variable resistors. Therefore, amount of current flowing between the input and output terminals of the indexer varies with a combination of the signature fuses which are cut or uncut.

Preferably, the indexer may include one or more variable resistors connected in parallel between input and output terminals of the indexer and signature fuses each of which is connected in series to corresponding one of the variable resistors. Therefore, amount of current flowing between the input and output terminals of the indexer varies with a combination of the signature fuses which are cut or uncut.

Preferably, the indexer may include one or more voltage reducing devices connected in series between input and output terminals of the indexer and signature fuses each of which is connected in parallel to a different number of voltage reducing devices. Therefore, a voltage drop across the indexer determined by the different number of voltage reducing devices varies with a combination of the signature fuses which are cut or uncut.

By using an input circuit having one or more individual signature circuits according to the present invention, various kinds of information on a semiconductor device operating at high speed can be indexed. In addition, an individual signature circuit of the present invention can be used together with a waveform clamping circuit provided at an input port of a semiconductor device.

BRIEF DESCRIPTION OF THE DRAWINGS

The above objectives and advantages of the present invention will become more apparent by describing in detail preferred embodiments thereof with reference to the attached drawings in which.

DETAILED DESCRIPTION OF THE PRESENT INVENTION

Hereinafter, the present invention will be described in detail by explaining preferred embodiments of the present invention with reference to the attached drawings. Throughout the drawings, like reference numerals denote the same members.

Figure 3:
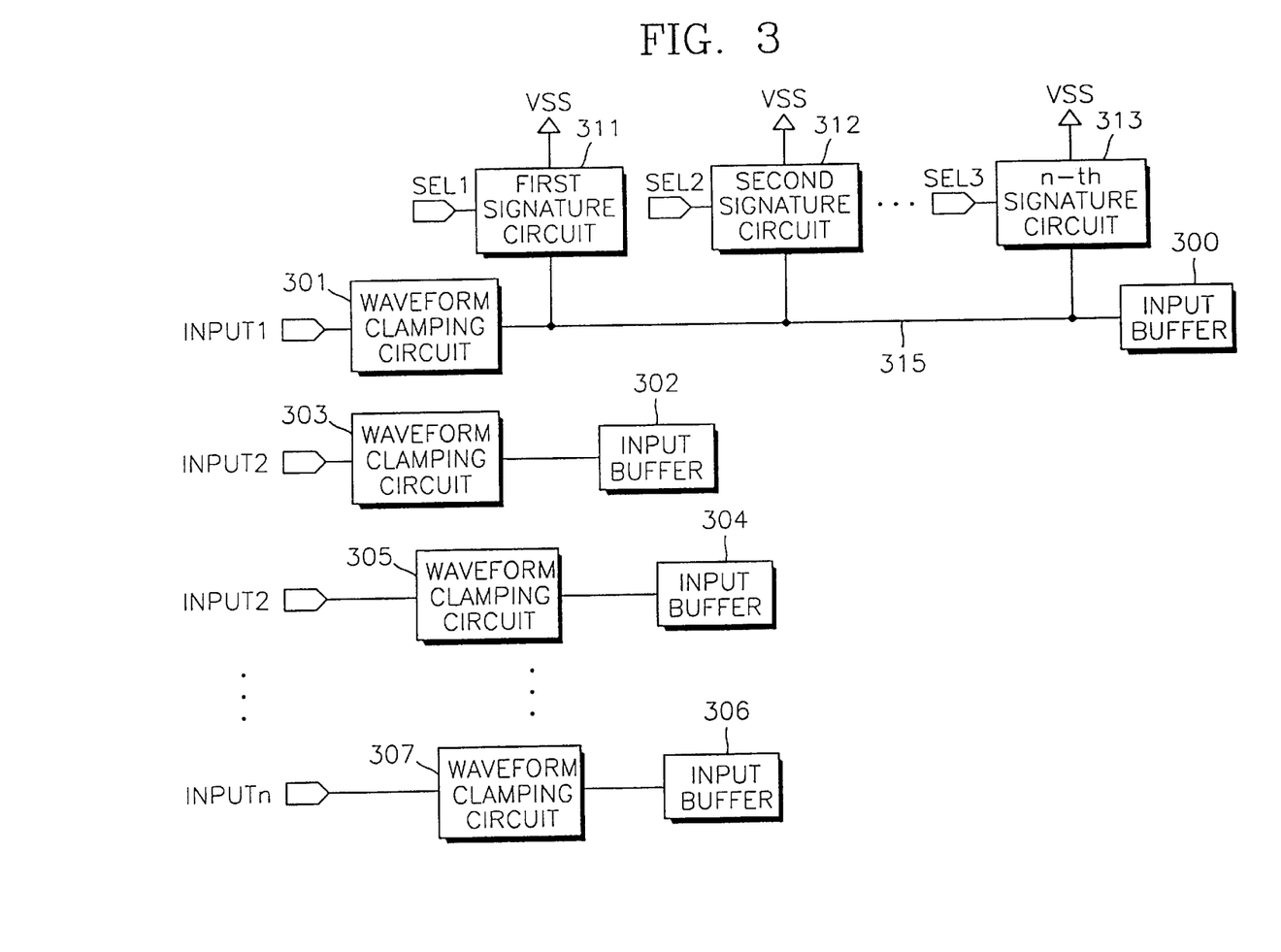
FIG. 3 is a diagram illustrating an embodiment of an input circuit in a semiconductor device according to the present invention.

FIG. 3 is a diagram illustrating an embodiment of an input circuit according to one aspect of the present invention. The input circuit of FIG. 3 includes input lines for transmitting signals applied to input ports INPUT1, INPUT2, INPUT3, . . . INPUTn to input buffers 300, 302, 304, . . . 306, respectively, and one or more individual signature circuits 311, 312 and 313 connected between an input line 315 and a predetermined voltage node VSS in parallel. The individual signature circuits 311, 312 and 313 are enabled in response to control signals SEL1, SEL2 and SEL3, respectively. For clarity of description, a port requesting relatively low speed interfacing is referred to as a slow input buffer 300, and a port requesting relatively high speed interfacing is referred to as a fast input buffer 302, 304 or 306.

In the input circuit of FIG. 3, one or more individual signature circuits 311, 312 and 313 are connected in parallel between the input line 315 of the slow input buffer 300 and the voltage node VSS, but no individual signature circuits are provided for the fast input buffers 302, 304 and 306. The individual signature circuits 311, 312 and 313 connected in parallel are enabled in response to control signals SEL1, SEL2 and SEL3, respectively.

Index information is read in such a manner that one of a plurality of individual signature circuits is enabled, and a voltage at which current starts flowing in the enabled individual signature circuit is detected while the voltage of the input line 315 is varied. For example, when index information of the first individual signature circuit 311 is read, the control signals SEL1, SEL2 and SEL3 are applied such that only the first individual signature circuit 311 is enabled, and the other individual signature circuits 312 and 313 are disabled. Next, a voltage applied to the input port INPUT1 is varied, and a voltage at which current starts flowing in the first individual signature circuit 311 is detected. After the index information of the first individual signature circuit 311 is read, the control signals SEL1 and SEL2 are applied such that the first individual signature circuit 311 is disabled, and the second individual signature circuit 312 is enabled.

After sequentially enabling all individual signature circuits and obtaining all necessary information, all the individual signature circuits 311, 312 and 313 are disabled. Therefore, all the individual signature circuits 311, 312 and 313 do not operate in a normal mode of a semiconductor device. Accordingly, even when the semiconductor device operates fast in high speed interfacing, impedance of an input port is not influenced in the semiconductor device.

The waveform clamping circuits 301, 303, 305 and 307 connected to the input buffers 300, 302, 304 and 306, respectively, correct the waveform of a signal applied thereto.

An external voltage applied to the individual signature circuits 311, 312 and 313 is preferably a ground voltage VSS because, if the external voltage is a power supply voltage VDD, a voltage higher than the external power supply voltage should be applied to detect current which starts flowing in an individual signature circuit. In addition, since the current flowing in an individual signature circuit can be detected when the waveform clamping circuit 301 does not operate (before the current flows across the waveform clamping circuit 301), the individual signature circuit can be used together with the waveform clamping circuit.

More preferably, each of the control signals SEL1, SEL2 and SEL3 is a mode register set (MRS) signal of a semiconductor device having the input circuit. When each of the control signals is an MRS signal, a special circuit for generating the control signals is not necessary.

In FIG. 3, the fast input buffers 302, 304 and 306 and the slow input buffer 300 are not absolutely determined, but are relatively determined depending on frequency of a signal applied to each of the input ports of a semiconductor device. In other words, one or more individual signature circuits are connected to a slow input buffer to which a relatively slow signal is applied, and no individual signature circuits are connected to the fast input buffers to which a relatively fast signal is applied, so that input impedance of the fast input buffer can be low.

The structure and the operation of an individual signature circuit 311, 312 or 313 of FIG. 3 will be described in detail with reference to FIGS. 4 through 13.

Figure 4:
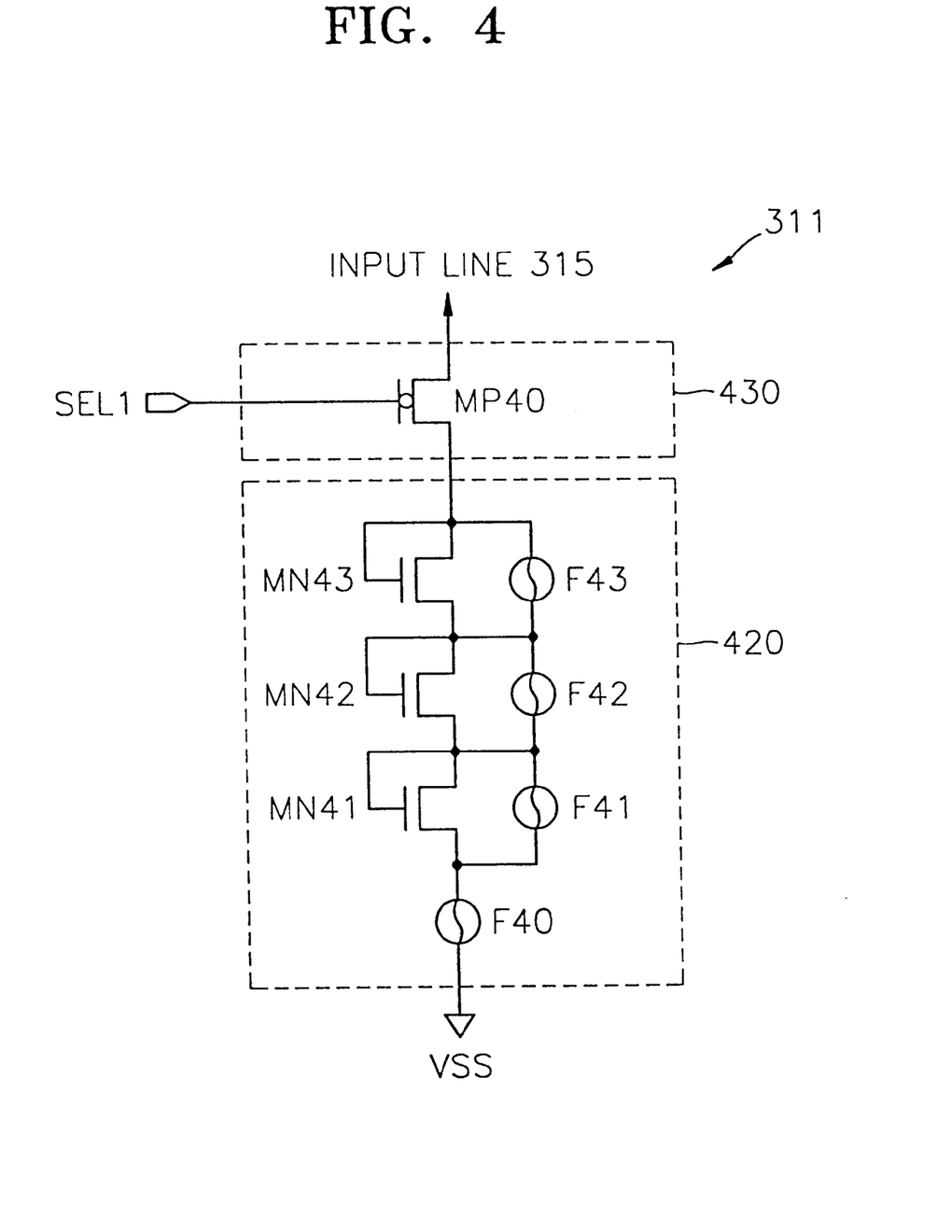
FIG. 4 is a diagram illustrating an embodiment of an individual signature circuit in an input circuit according to the present invention.

FIG. 4 is a diagram illustrating an embodiment of an individual signature circuit according to the present invention. The individual signature circuit 311 of FIG. 4 includes an indexer 420 and a selector 430 connected in series between an voltage node VSS and an input line 315. Substantially, both terminals of the selector 430 are electrically short-circuited or snapped in response to a control signal SEL1. The indexer 420 includes one or more NMOS transistors MN41, MN42 and MN43 connected in series between the selector 430 and the voltage node VSS and signature fuses F41, F42 and F43 each of which is connected in parallel to each of the transistors MN41, MN42 and MN43, respectively. The indexer 420 also includes a master fuse F40 connected in series between the voltage node VSS and the transistor MN41.

In the indexer 420 of the individual signature circuit 311, information on a semiconductor device is indexed. The selector 430 also includes a master transistor MP40 gated with the control signal SEL1.

The following description concerns the detailed operation of the individual signature circuit 311. For clarity of the description, it is assumed that a semiconductor device is a dynamic random access memory (DRAM), and the DRAM is designed in X4 and X8 modes and is packaged in the X4 mode. It is also assumed that the master and signature fuses F40, F41, F42 and F43 are not cut when the DRAM is in the X4 mode, and the signature fuses F42 and F43 are cut when the DRAM is in the X8 mode. This assumption is only to give an example established during processes. Thus, the present invention may apply to semiconductor devices having other types of modes regardless of the assumption.

Under the conditions described above, information on the mode in which the DRAM is designed is obtained through the following procedure. Firstly, the control signal SEL1 is applied as logic "low (L)", thereby turning on the master transistor MP40. Then, the individual signature circuit 311 is enabled (that is, the selector 430 short-circuits). Subsequently, a varied voltage is applied to the input line 315, and simultaneously, current flowing across the individual signature circuit 311 is detected. When a voltage VIN of the input line 315 at which current starts to be detected in the signature circuit 311 satisfies Equation (1) below, the signature fuses F40 and F41 are not cut.

$$VIN > VSS + V_{TN43} + V_{TN42} \qquad (1)$$

where $V_{TN42}$ and $V_{TN43}$ are the threshold voltages of the NMOS transistors MN42 and MN43. Consequently, the signature fuses F42 and F43 are cut. Therefore, it is concluded that the DRAM is designed in the X8 mode according to the above assumption.

On the other hand, if current flows across the individual signature circuit 311 when the voltage VIN of the input line 315 satisfies Equation (2) below, it can be concluded that the transistors MN41, MN42 and MN43 are all bypassed.

$$VIN > VSS \qquad (2)$$

Accordingly, the signature fuses F40, F41, F42 and F43 are not cut, and thus it is concluded that the DRAM is designed in the X4 mode.

Referring to FIG. 3 again, after the index information of the first individual signature circuit 311 is read as described above, only the control signal SEL2 is applied as logic "L", and the other control signals SEL1 and SEL3 are applied as logic "high (H)". Thus, only the second individual signature circuit 312 is enabled, and index information of the second individual signature circuit 312 can be obtained through the same method as described above.

When the semiconductor device operates normally after the procedure of reading the index information from the individual signature circuits 311–313, the control signal SEL1 having "H (VDD)" potential is applied to the gate of the master transistor MP40 (referring to FIG. 4), and thus the master transistor MP40 is disabled. Then, the master transistor MP40 is in an off state. Accordingly, the present invention has an additional advantage in decreasing input impedance by the gate overlap capacitance of the master transistor MP40.

The present invention is not restricted to the structure of the indexer 420 of FIG. 4. For example, the fuses F41, F42 and F43 do not need to be connected to the transistors MN41, MN42 and MN43, respectively, in parallel. However, the number of cases where each transistor can be bypassed can be increased when an equal number of fuses and transistors are provided. Accordingly, the structure of the indexer 420 of FIG. 4 is only an example for describing the present invention, and any structure, in which a voltage drop between the input line 315 and the ground voltage VSS can be varied with a combination of fuses which are cut or uncut, can be used in the present invention. In addition, the indexer 420 of FIG. 4 is not limited to the structure having the three transistors. As the indexer 420 includes more transistors, the number of indexes represented by the indexer 420 is increased. Moreover, the transistors of the indexer 420 do not need to be NMOS type. Instead of the NMOS type transistors, bipolar transistors (not shown) and diodes (not shown) which can provoke a predetermined voltage drop can be used.

Meanwhile, a selector in an individual signature circuit according to the present invention is not restricted to the structure of the selector 430 of FIG. 4. Any structure enabling the operations of the individual signature circuit 311 can be used as the selector. Accordingly, the selector 430 may be a switch (not shown) which short-circuits or snaps in response to the control signal SEL1, or may be a bipolar transistor (not shown) in which the control signal SEL1 is applied to the base.

Figure 5:
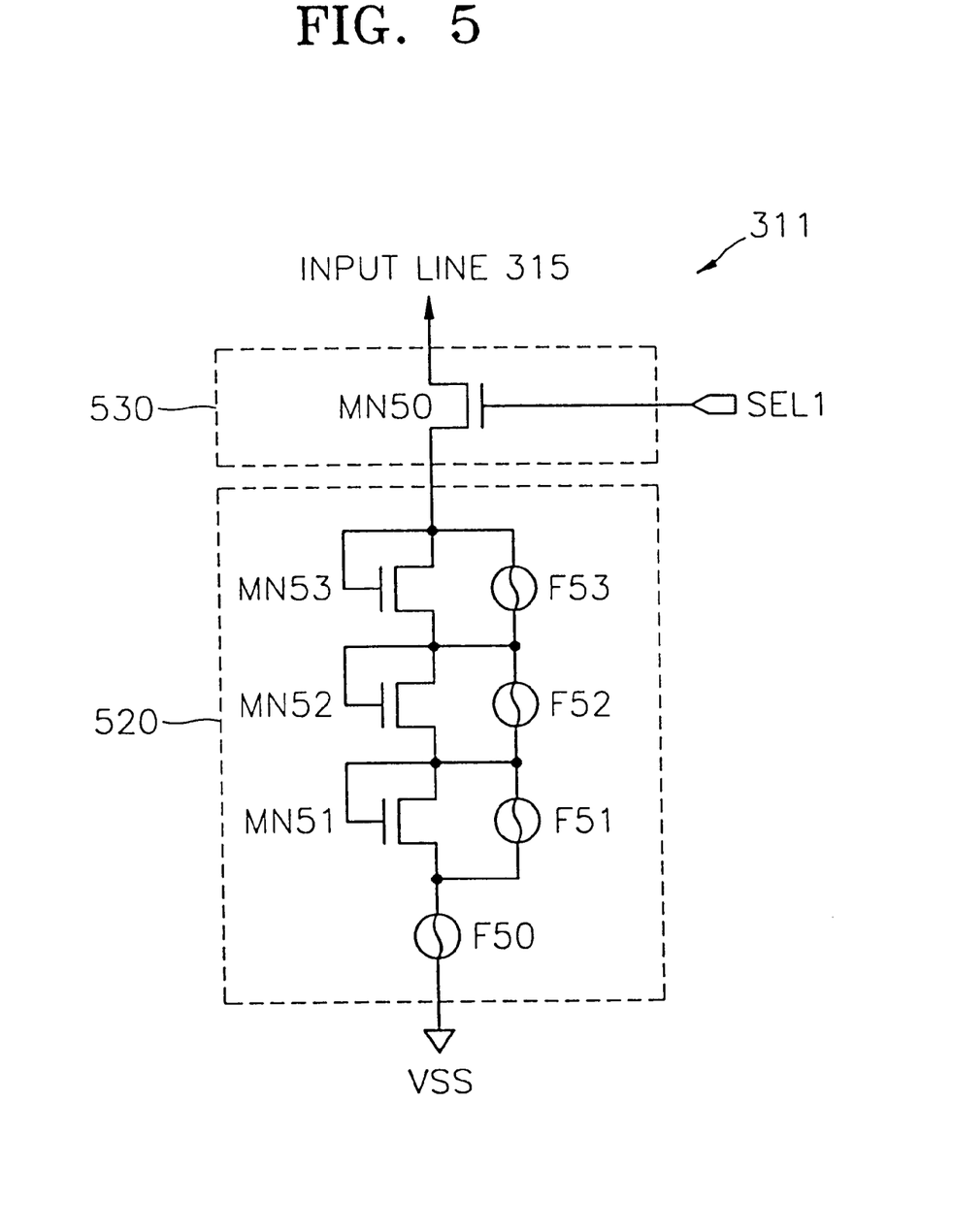
FIG. 5 is a diagram illustrating another embodiment of an individual signature circuit according to the present invention.

FIG. 5 is a diagram illustrating another embodiment of an individual signature circuit according to the present invention. The individual signature circuit 311 includes a selector 530 and an indexer 520. The selector 530 is composed of a master transistor MN50. The indexer 520 includes NMOS transistors MN51, MN52 and MN53 and signature fuses F51, F52 and F53. The indexer 520 also includes a master fuse F50.

The structure of the individual signature circuit 311 of FIG. 5 is similar to that of the individual signature circuit of FIG. 4, with the exception that the master transistor MN50 is an NMOS transistor. Accordingly, a control signal SEL1 is applied as logic "H" to turn on the master transistor MN50. Like the embodiment of FIG. 4, in the case where all the fuses F50, F51, F52 and F53 are uncut, if the master transistor MN50 does not exist, an input line 315 sees the gate overlap capacitance of the NMOS transistors MN51, MN52 and MN53. However, by connecting the master transistor MN50 between the input line 315 and the indexer 520, the input line 315 can be made to see the gate overlap capacitance of only the master transistor MN50. The other operations of the embodiment of FIG. 5 are similar to those of the embodiment of FIG. 4, and thus detailed descriptions thereof will be omitted.

Figure 6:
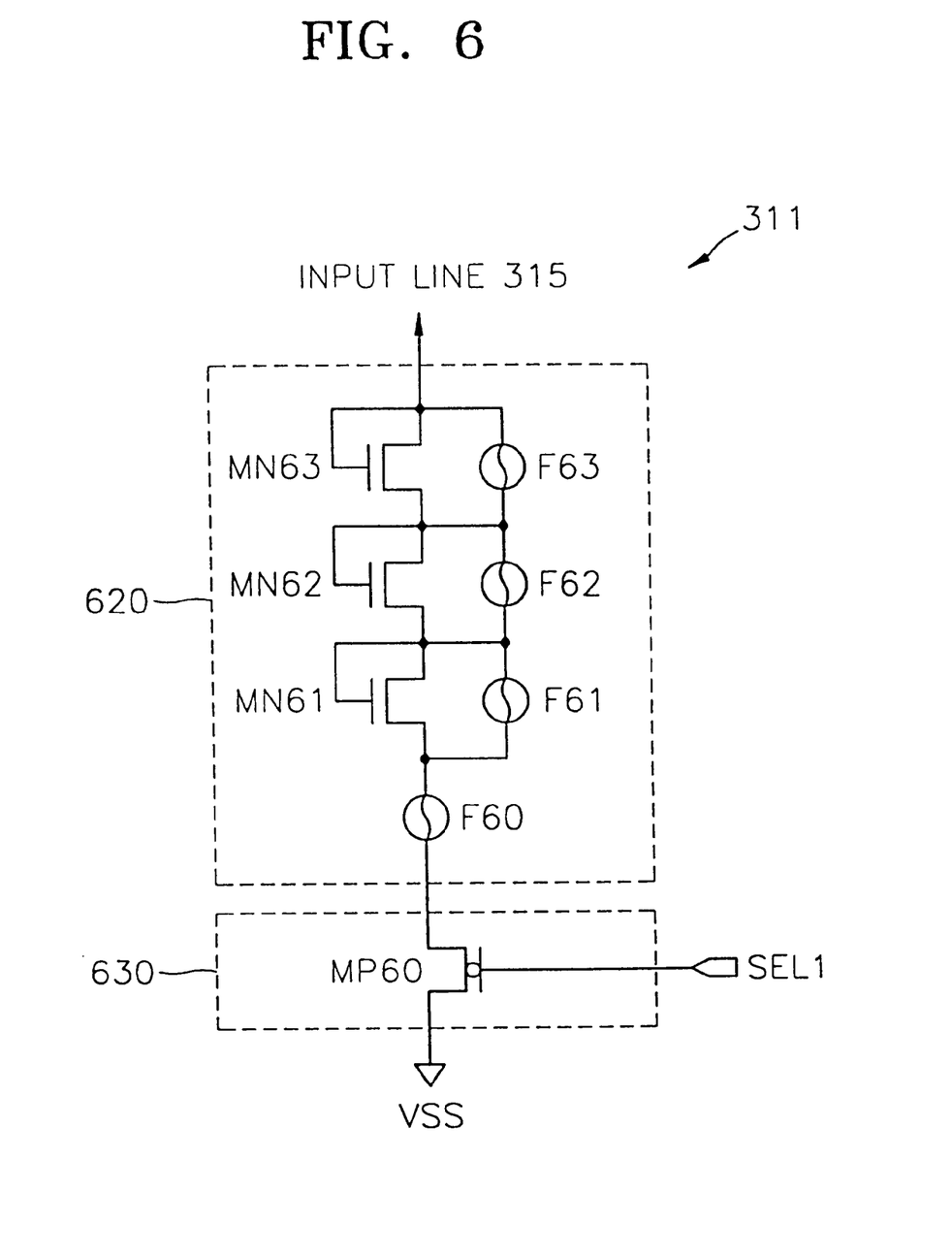
FIG. 6 is a diagram illustrating still another embodiment of an individual signature circuit according to the present invention.
Figure 7:
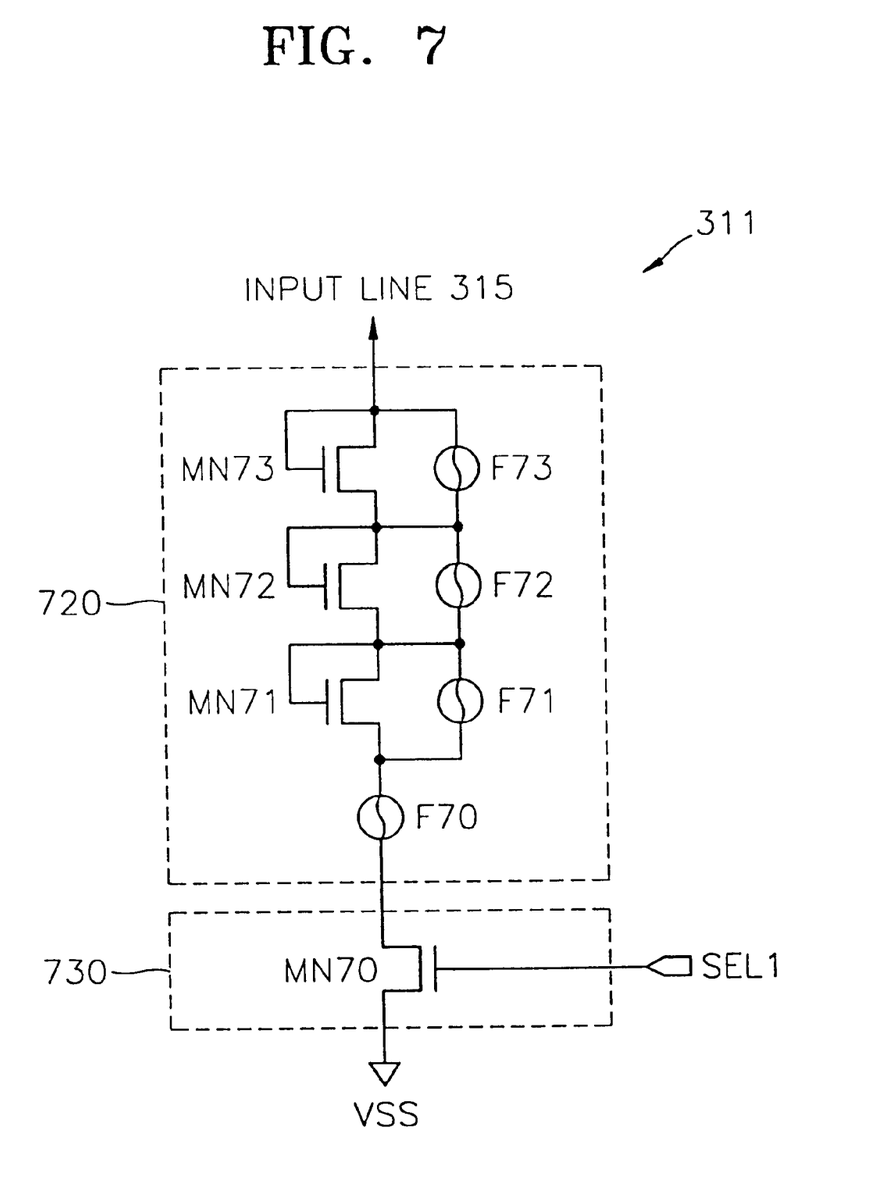
FIG. 7 is a diagram illustrating yet another embodiment of an individual signature circuit according to the present invention.

FIGS. 6 and 7 are diagrams illustrating different embodiments of an individual signature circuit according to the present invention.

In the individual signature circuit 311 of FIG. 6, a selector 630 includes a master transistor MP60. An indexer 620 includes NMOS transistors MN61, MN62 and MN63 and signature fuses F61, F62 and F63. The indexer 620 also includes a master fuse F60. An indexer 720 of FIG. 7 has the same structure as the indexer 620 of FIG. 6. Unlike the selector 630 of FIG. 6, a selector 730 in FIG. 7 includes a master transistor MN70 of NMOS type.

In the embodiment of an individual signature circuit shown in FIG. 6 or 7, the selector 630 or 730 is connected to a ground voltage VSS, and the indexer 620 or 720 is connected between the selector 630 or 730 and an input line 315. Preferably, the indexer 620 or 720 may further include a transistor (not shown), whose gate and source are connected to each other, between the drain of the transistor MN63 or MN73 and the input line 315. When such a transistor is further provided, gate overlap capacitance seen by the input line 315 can be reduced when all fuses are uncut.

The other operations of the individual signature circuits of FIGS. 6 and 7 are similar to those of the individual signature circuits of FIGS. 4 and 5, respectively, and thus detailed descriptions thereof will be omitted.

Figure 8:
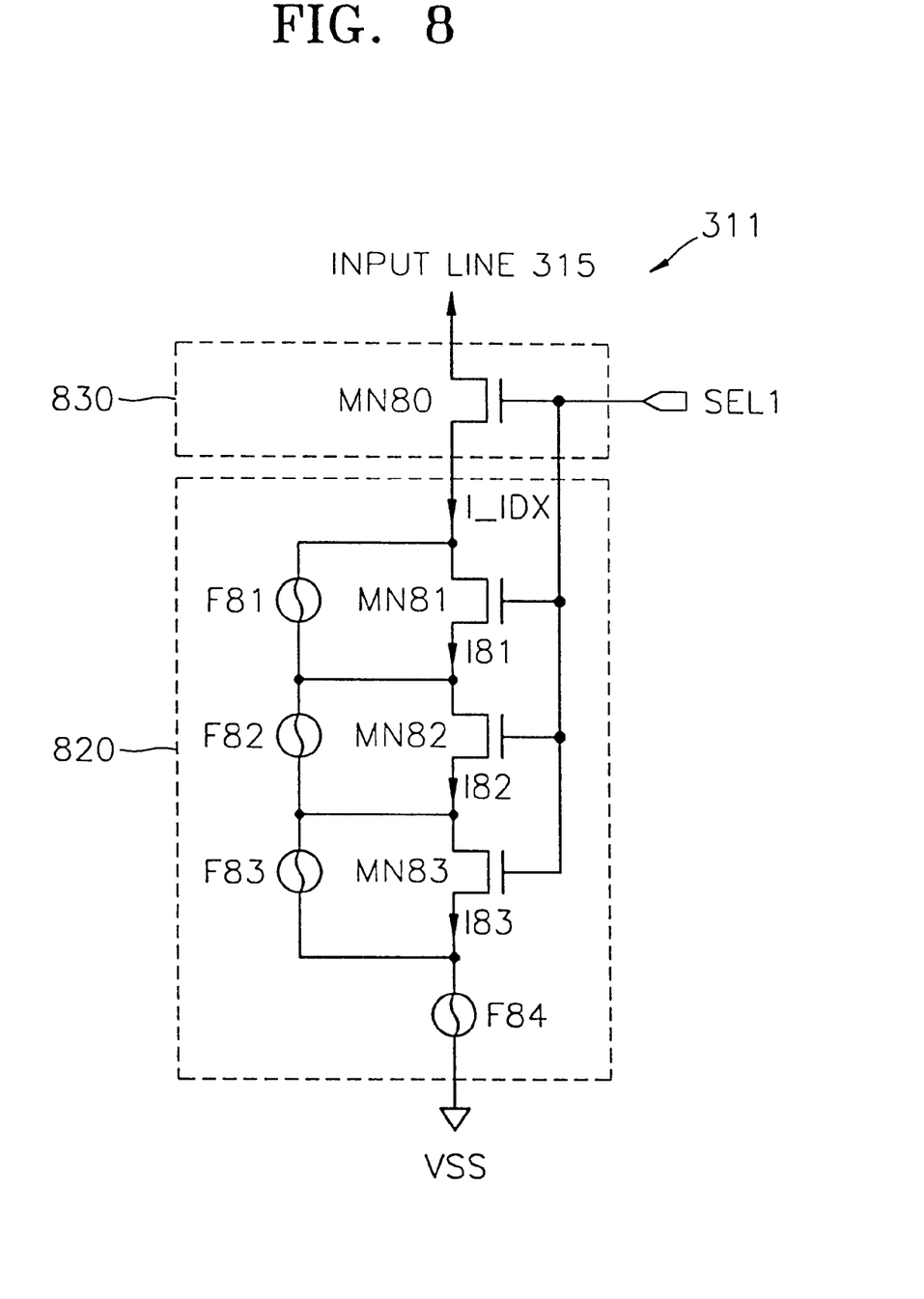
FIG. 8 is a diagram illustrating yet another embodiment of an individual signature circuit according to the present invention.

FIG. 8 is a diagram illustrating yet another embodiment of an individual signature circuit according to the present invention. The individual signature circuit 311 of FIG. 8 includes an indexer 820 and a selector 830 connected in series between an voltage node VSS and an input line 315. Both terminals of the selector 830 are electrically short-circuited or snapped in response to a first control signal SEL1. The indexer 820 includes one or more NMOS transistors MN81, MN82 and MN83 connected in series between the selector 830 and the voltage node VSS and signature fuses F81, F82 and F83 connected in parallel to the transistors MN81, MN82 and MN83, respectively. The indexer 820 preferably includes a master fuse F84 connected in series between the transistor MN83 and the voltage node VSS.

During an indexing process, the control signal SEL1 is applied to the gate of the master transistor MN80 of the selector 830 as logic "H". Then, the master transistor MN80 is turned on in response to the control signal SEL1, and the transistors MN81, MN82 and MN83 of the indexer 820 are also turned on. However, the transistors MN81, MN82 and MN83 are selectively bypassed due to the fuses F81, F82 and F83 connected in parallel to the transistors MN81, MN82 and MN83, respectively. Therefore, when a ratio of width to length W/L is set differently in the respective transistors MN81, MN82 and MN83, and two of the transistors MN81, MN82 and MN83 are bypassed, the amount of current I_IDX flowing in the indexer 820 varies depending on which two of the transistors MN81–MN83 are bypassed.

For example, it is assumed that the amount of current I_IDX flowing in the indexer 820 is 10 mA when the semiconductor device is packaged in X4 mode, and the amount of current I_IDX flowing in the indexer 820 is 20 mA when the semiconductor device is packaged in X8 mode. In addition, it is assumed that W/L ratio of the transistor MN81 is larger than W/L ratio of the transistor MN83. As mentioned above, these assumptions are only examples. Then, current I81 flowing when the fuse F81 is cut is larger than current I82 flowing when the fuse F82 is cut. Therefore, by adjusting various parameters, the amount of current I_IDX can be set to 20 mA or 10 mA.

Accordingly, when the fuses F82 and F83 are not cut and only the fuse F81 is cut, it can be concluded that the semiconductor device is packaged in the X8 mode. When the fuses F81 and F83 are not cut and the fuse F82 is cut, it can be concluded that the semiconductor device is packaged in the X4 mode.

Unlike the individual signature circuits according to the embodiments of FIGS. 4 through 7 which obtain index information from the voltage level of an input line, the individual signature circuit according to the embodiment of FIG. 8 obtains index information from the amount of current flowing in an input line. According to such a structure as shown in FIG. 8, a process of varying a voltage until current starts flowing in an input line can be avoided.

Preferably, the W/L ratios of the transistors MN81, MN82 and MN83 in the indexer 820 are greatly different from one another so that the variation of current I_IDX can be easily detected. In addition, when the W/L ratios of the transistors MN81, MN82 and MN83 in the indexer 820 are greatly different from one another, the influence of process variation occurring during semiconductor fabrication can be decreased.

Variable resistors of the indexer 820 are not restricted to NMOS transistors, but any kind of resistors which can receive the control signal SEL1 and generate current can be used. Accordingly, the variable resistors may be PMOS transistors (not shown) gated with the control signal or bipolar transistors (not shown) in which the control signal is applied to the base. Alternatively, the variable resistors may have different resistances. When the indexer 820 includes bipolar transistors (not shown), the bipolar transistors preferably have different values of current gain.

A selector in a signature circuit of the present invention is not restricted to the structure of the selector 830. Any structure which enables the operations of the individual signature circuit 311 can be used. Therefore, the selector 830 may be a switch (now shown) which short-circuits or snaps in response to the control signal SEL1, or may be a bipolar transistor (not shown) in which the control signal SEL1 is applied to the base.

Figure 9:
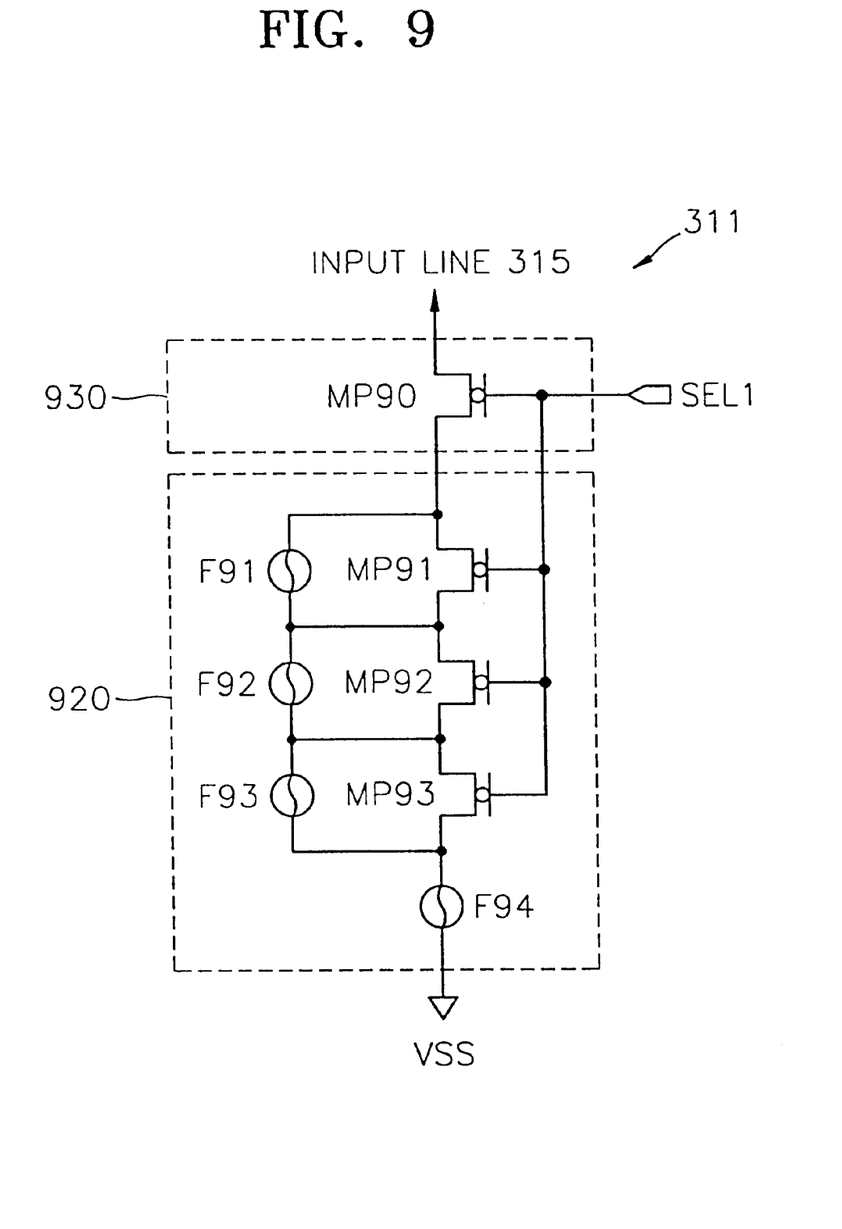
FIG. 9 is a diagram illustrating yet another embodiment of an individual signature circuit according to the present invention.

FIG. 9 is a diagram illustrating yet another embodiment of an individual signature circuit according to the present invention. An indexer 920 of the individual signature circuit 311 shown in FIG. 9 includes one or more transistors MP91, MP92 and MP93 connected in series between a selector 930 and a ground voltage VSS and signature fuses F91, F92 and F93 connected in parallel to the transistors MP91, MP92 and MP93, respectively.

The structure of the individual signature circuit 311 according to the embodiment of FIG. 9 is similar to that of the embodiment of FIG. 8, with the exception that the transistors MP90, MP91, MP92 and MP93 of the selector 930 and the indexer 920 are PMOS type. Thus, a detailed description thereof is omitted.

Figure 10:
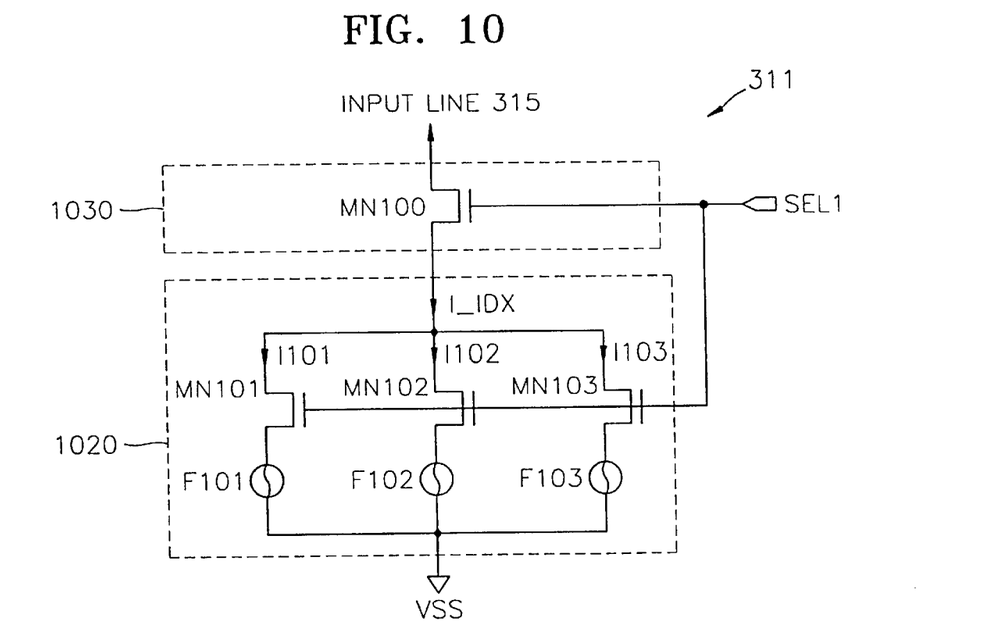
FIG. 10 is a diagram illustrating yet another embodiment of an individual signature circuit according to the present invention.

FIG. 10 is a diagram illustrating another embodiment of an individual signature circuit according to the present invention. The individual signature circuit 311 of FIG. 10 includes an indexer 1020 and a selector 1030 connected in series between a ground voltage VSS and an input line 315. Substantially, the two terminals of the selector 1030 are electrically short-circuited or snapped in response to a control signal SEL1. The indexer 1020 includes three transistors MN101, MN102 and MN103 connected in parallel between the selector 1030 and the ground voltage VSS and signature fuses F101, F102 and F103 connected between the respective transistors MN101, MN102 and MN103 and the ground voltage VSS in series. The amount of current I_IDX flowing between the two terminals of the indexer 1020 varies with a combination of the signature fuses F101, F102 and F103 which are cut or uncut.

During an indexing process, the control signal SEL1 is applied to the gate of a master transistor MN100 of the selector 1030 as logic "H". Then, the master transistor MN100 is turned on in response to the control signal SEL1, and the transistors MN101, MN102 and MN103 of the indexer 1020 are also turned on. However, the transistors MN101, MN102 and MN103 are selectively bypassed due to the fuses F101, F102 and F103 connected between the drains of the respective transistors MN101, MN102 and MN103 and the ground voltage VSS. Therefore, when W/L ratios of the transistors MN101, MN102 and MN103 are set to be different from one another, index current I_IDX varies with a combination of the fuses which are cut. This is because the index current I_IDX is the sum of currents 1101, 1102 and 1103 flowing through the transistors MN101, MN102 and MN103, respectively. It is noted that the structure of the indexer 1020 shown in FIG. 10 should not be construed in restrictive sense.

Figure 11:
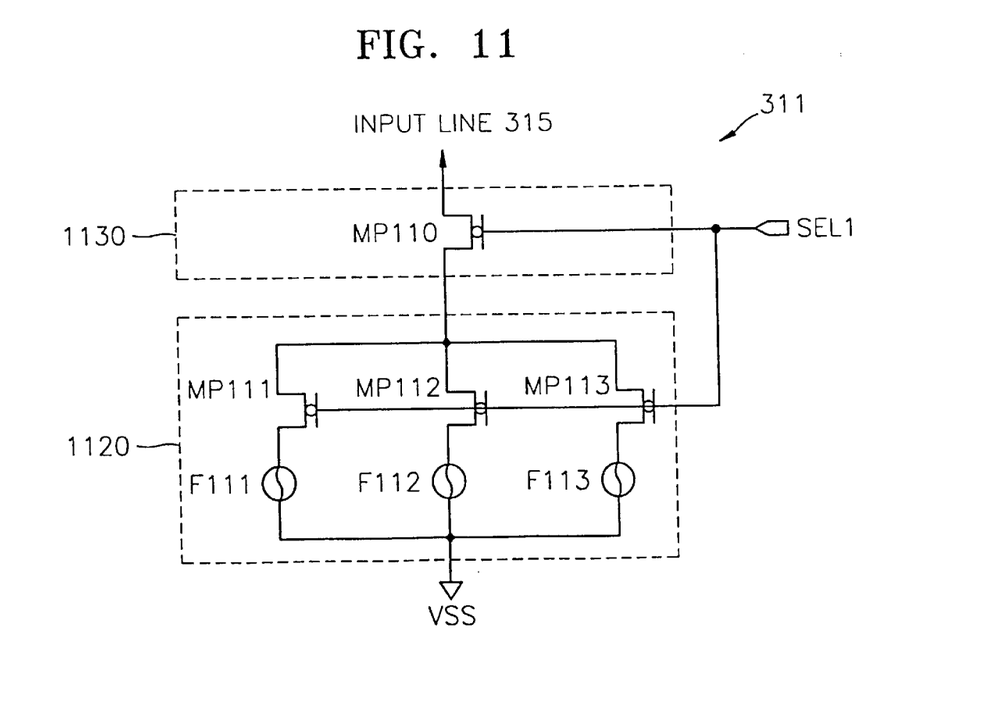
FIG. 11 is a diagram illustrating still another embodiment of an individual signature circuit according to the present invention.

FIG. 11 is a diagram illustrating still another embodiment of an individual signature circuit according to the present invention. An indexer 1120 of FIG. 11 includes three transistors MP111, MP112 and MP113 connected in parallel between a selector 1130 and a ground voltage VSS and signature fuses F11, F112 and F113 connected between the respective transistors MP111, MP112 and MP113 and the ground voltage VSS in series.

The individual signature circuit of FIG. 11 is different from that of FIG. 10 in that the transistors MP110, MP111, MP112 and MP113 of the indexer 1120 and the selector 1130 are PMOS type. Other than this difference, the structure and the operation of the individual signature circuit of FIG. 11 are similar to those of the individual signature circuit of FIG. 10, and thus a detailed description thereof will be omitted.

Figure 12:
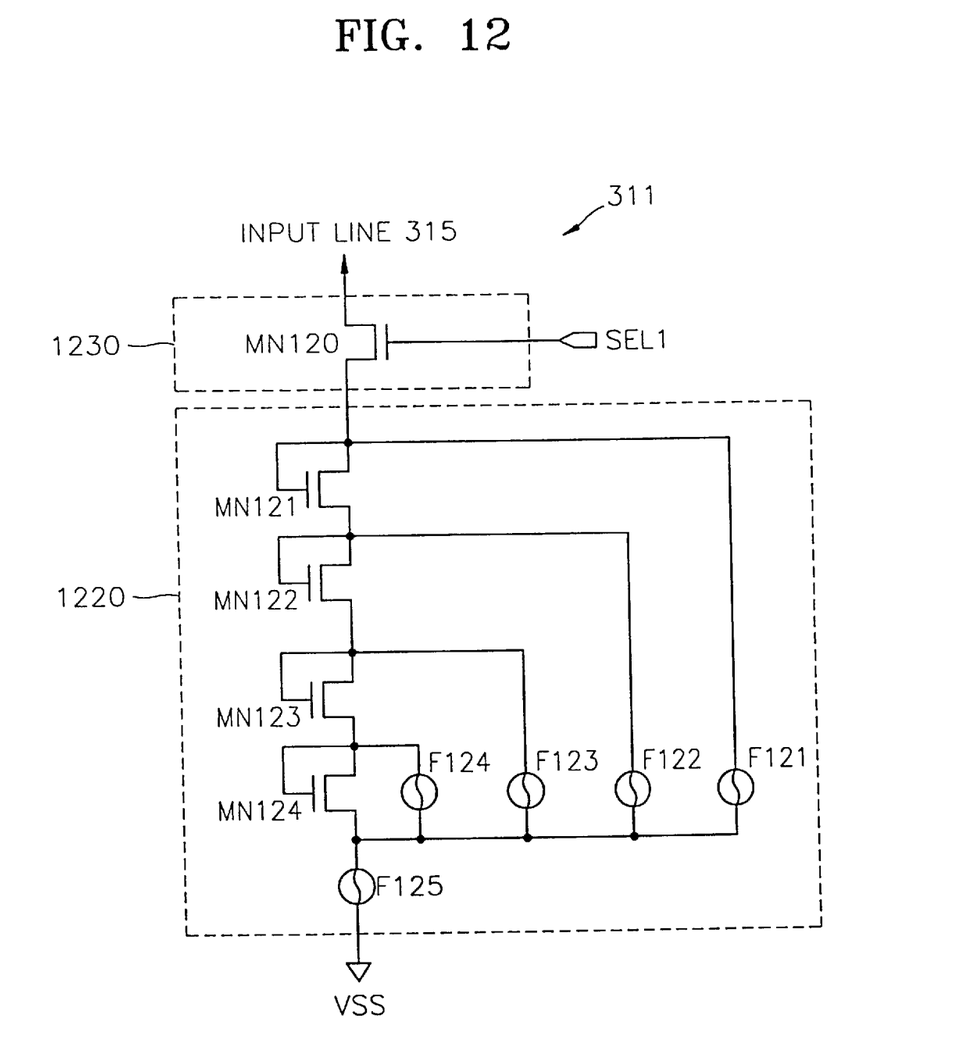
FIG. 12 is a diagram illustrating yet another embodiment of an individual signature circuit according to the present invention.

FIG. 12 is a diagram illustrating yet another embodiment of an individual signature circuit according to the present invention. The individual signature circuit 311 of FIG. 12 includes an indexer 1220 and a selector 1230 connected in series between a ground voltage VSS and an input line 315. Substantially, the two terminals of the selector 1230 are electrically short-circuited or snapped in response to a control signal SEL1. The indexer 1220 includes four transistors MN121, MN122, MN123 and MN124 connected in series between the selector1230 and the ground voltage VSS and signature fuses F121, F122, F123 and F124 connecting the source of the transistor MN124 to the drains of the respective transistors MN121, MN122, MN123 and MN124. The number of transistors bypassed varies depending on a combination of the signature fuses F121, F122, F123 and F124 which are cut or uncut, and thus voltage drop in the indexer 1220 varies. Preferably, the indexer 1220 also includes a master fuse F125 connected in series between the source of the transistor MN124 and the ground voltage VSS.

Arrangement of the fuses in the indexer 1220 of FIG. 12 is different than that of the fuses in FIGS. 4 through 7. When an outer fuse (for example, F121) is not cut in FIG. 12, the transistors between the two terminals of the outer fuse (F121) are all bypassed regardless of the states of inner fuses (for example, F122, F123 and F124). In other words, unlike the structures of the indexers of FIGS. 4 through 7, when an outer fuse (for example, F121) is not cut, this has the same effect as all inner fuses (for example, F122, F123 and F124) are not cut. Accordingly, the number of transistors bypassed can be adjusted using a single outer fuse. For example, the four transistors MN121, MN122, MN123 and MN124 can be bypassed using the fuse F121. By using the fuse F122, the three transistors MN122, MN123 and MN124 can be bypassed.

The structure and the operation of FIG. 12 other than what is described above are similar to those of FIGS. 4 through 7, and thus detailed descriptions thereof will be omitted.

Figure 13:
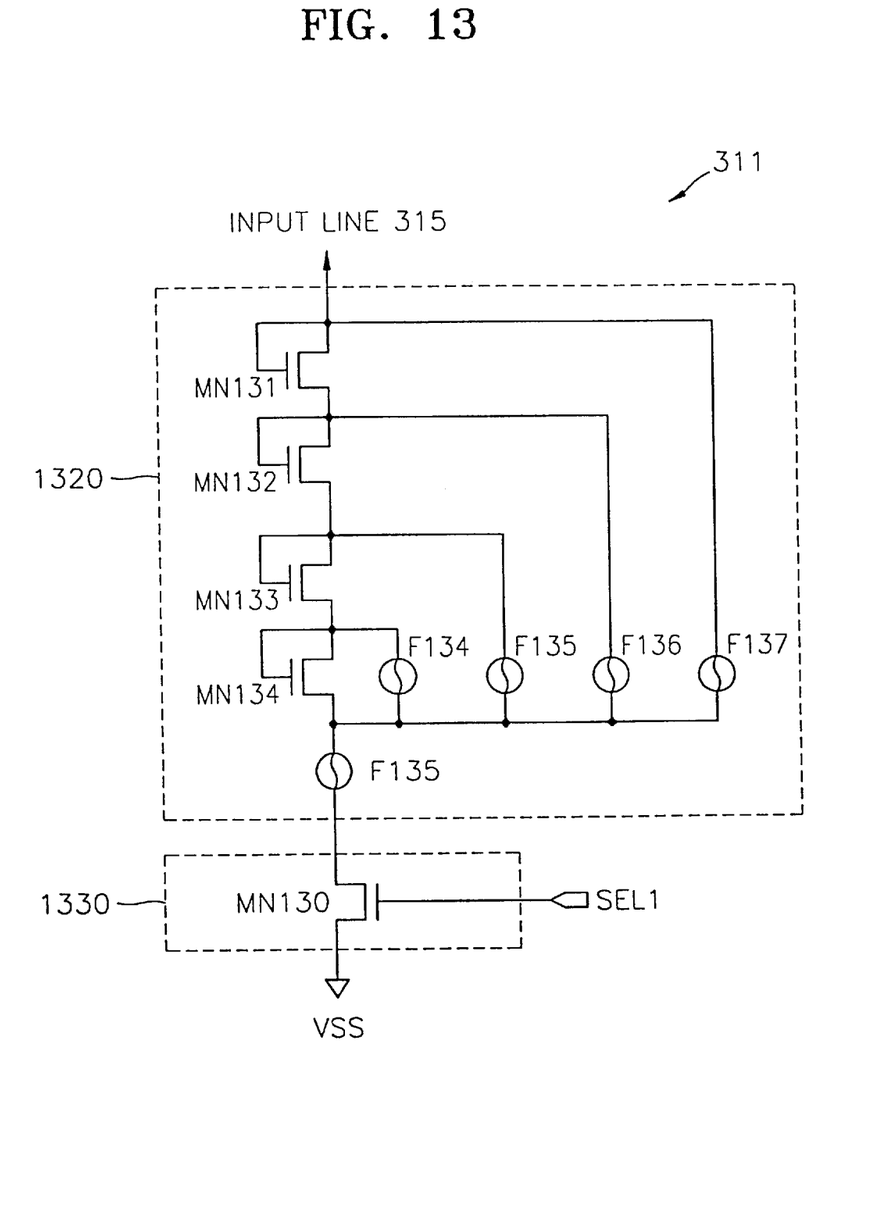
FIG. 13 is a diagram illustrating yet another embodiment of an individual signature circuit according to the present invention.

FIG. 13 is a diagram illustrating yet another embodiment of an individual signature circuit according to the present invention. An indexer 1320 includes four transistors MN131, MN132, MN133 and MN134 and signature fuses F134, F135, F136 and F137, of which arrangement is the same as that of the indexer 1220 shown in FIG. 12.

The individual signature circuit 311 of FIG. 13 is different than that of FIG. 12 in that a selector 1330 is connected between the indexer 1320 and a ground voltage VSS in series. Except for this difference, the structure and the operation of the signature circuit in FIG. 13 are similar to those of the signature circuit in FIG. 12, and thus detailed descriptions thereof will be omitted.

An individual signature circuit according to the present invention is not restricted to the structures shown in the embodiments of FIGS. 4 through 13. Any structure, in which a voltage of an input line in an input circuit which allows current to flow in a signature circuit can be varied depending on arrangement of voltage reducing devices or variable resistors and signature fuses corresponding thereto, can be used.

Although the present invention has been described with reference to particular embodiments, it will be apparent to one of ordinary skill in the art that modifications of the described embodiments may be made. Therefore, the scope of the invention will be defined by the appended claims.

In an input circuit having parallel individual signature circuits in a semiconductor device according to the present invention, the individual signature circuits can be selectively driven in a particular test mode so that a bad influence of the signature circuit on a product can be prevented. An input circuit having parallel signature circuits according to the present invention is compatible with a semiconductor device operating at high speed and ensures a large number of indexes. In addition, the signature circuits can be used together with a waveform clamping circuit provided at an input port of the semiconductor device.

What is claimed is:

1. A semiconductor device having an input line for propagating a signal applied from an input port to an input buffer in the semiconductor device, the semiconductor device comprising two or more signature circuits connected in parallel between the input line and a voltage node, the signature circuits being selectively enabled in response to a control signal, wherein at least one of the two or more signature circuits includes an indexer and a selector connected in series between the voltage node and the input line, wherein two terminals of the selector are electrically short-circuited or opened in response to the control signal, the indexer comprises one or more voltage reducing devices connected in series between input and output terminals of the indexer and signature fuses, each of which is connected in parallel to corresponding one of the voltage reducing devices, and a voltage drop in the indexer varies with a combination of the signature fuses which are cut or uncut.

2. The semiconductor device of claim 1, wherein the indexer further comprises a master fuse connected between one of the voltage reducing devices and one of the input and output terminals of the indexer.

3. The semiconductor device of claim 1, wherein each of the voltage reducing devices includes a metal oxide semiconductor (MOS) transistor of which gate and source electrodes are electrically connected to each other, wherein two adjacent MOS transistors included in two adjacent voltage reducing devices, respectively, are electrically connected such that source electrode of one MOS transistor is connected to drain electrode of the other MOS transistor.

4. The semiconductor of claim 1, wherein the selector comprises a switch connected between the two terminals of the selector, the switch making the two terminals of the selector are electrically short-circuited or opened in response to the control signal.

5. The semiconductor device of claim 4, wherein the switch includes a MOS transistor gated with the control signal, source and drain electrodes of the MOS transistor being connected to the two terminals of the selector, respectively.

6. A semiconductor device having an input line for propagating a signal applied from an input port to an input buffer in the semiconductor device, the semiconductor device comprising two or more signature circuits connected in parallel between the input line and a voltage node, the signature circuits being selectively enabled in response to a control signal, wherein the control signal is a mode register set signal of which value varies depending on a mode of the semiconductor device.

7. A semiconductor device having an input line for propagating a signal applied from an input port to an input buffer in the semiconductor device, the semiconductor device comprising two or more signature circuits connected in parallel between the input line and a voltage node, the signature circuits being selectively enabled in response to a control signal, wherein at least one of the two or more signature circuits includes an indexer and a selector connected in series between the voltage node and the input line, wherein two terminals of the selector are electrically short-circuited or opened in response to the control signal, the indexer comprises one or more variable resistors connected in series between input and output terminals of the indexer and signature fuses, each of which is connected in parallel to corresponding one of the variable resistors, and amount of current flowing between the input and output terminals of the indexer varies with a combination of the signature fuses which are cut or uncut.

8. The semiconductor device of claim 7, wherein the indexer further comprises a master fuse connected between one of the variable resistors and one of the input and output terminals of the indexer.

9. The semiconductor device of claim 7, wherein each of the variable resistors is a MOS transistor in which the control signal is applied to gate electrode, and two adjacent MOS transistors of the variable resistors are electrically connected such that source electrode of one MOS transistor is connected to drain electrode of the other MOS transistor.

10. The semiconductor device of claim 9, wherein MOS transistors of the variable resistors have different ratios of width to length.

11. The semiconductor device of claim 7, wherein the selector comprises a switch connected between the two terminals of the selector, the switch making the two terminals of the selector are electrically short-circuited or opened in response to the control signal.

12. The semiconductor device of claim 11, wherein the switch includes a MOS transistor gated with the control signal, source and drain electrodes of the MOS transistor being connected to the two terminals of the selector, respectively.

13. The semiconductor device of claim 7, wherein the control signal is a mode register set signal of which value varies depending on a mode of the semiconductor device.

14. A semiconductor device having an input line for propagating a signal applied from an input port to an input buffer in the semiconductor device, the semiconductor device comprising two or more signature circuits connected in parallel between the input line and a voltage node, the signature circuits being selectively enabled in response to a control signal, wherein at least one of the two or more signature circuits includes an indexer and a selector connected in series between the voltage node and the input line, wherein two terminals of the selector are electrically short-circuited or opened in response to the control signal, the indexer comprises one or more variable resistors connected in parallel between input and output terminals of the indexer and signature fuses, each of which is connected in series to corresponding one of the variable resistors, and amount of current flowing between the input and output terminals of the indexer varies with a combination of the signature fuses which are cut or uncut.

15. The semiconductor device of claim 14, wherein each of the variable resistors is a MOS transistor in which the control signal is applied to gate electrode, wherein amount of current flowing between drain and source electrodes of the MOS transistor varies with the control signal.

16. The semiconductor device of claim 15, wherein MOS transistors of the variable resistors have different ratios of width to length.

17. The semiconductor device of claim 14, wherein the selector comprises a switch connected between the two terminals of the selector, the switch making the two terminals of the selector are electrically short-circuited or opened in response to the control signal.

18. The individual signature circuit of claim 17, wherein the switch includes a MOS transistor gated with the control signal, source and drain electrodes of the MOS transistor being connected to the two terminals of the selector, respectively.

19. The semiconductor device of claim 14, wherein the control signal is a mode register set signal of which value varies depending on a mode of the semiconductor device.

20. A semiconductor device having an input line for propagating a signal applied from an input port to an input buffer in the semiconductor device, the semiconductor device comprising two or more signature circuits connected in parallel between the input line and a voltage node, the signature circuits being selectively enabled in response to a control signal, wherein at least one of the two or more signature circuits includes an indexer and a selector connected in series between the voltage node and the input line, wherein two terminals of the selector are electrically short-circuited or opened in response to the control signal, the indexer comprises one or more voltage reducing devices connected in series between input and output terminals of the indexer and signature fuses, each of which is connected in parallel to a different number of voltage reducing devices, and a voltage drop across the indexer determined by the different number of voltage reducing devices varies with a combination of the signature fuses which are cut or uncut.

21. The semiconductor device of claim 20, wherein the indexer further comprises a master fuse connected between one of the signature fuses and one of the input and output terminals of the indexer.

22. The semiconductor device of claim 20, wherein each of the voltage reducing devices includes a MOS transistor in which gate and source electrodes are electrically connected to each other, wherein two adjacent MOS transistors included in two adjacent voltage reducing devices, respectively, are electrically connected such that source electrode of one MOS transistor is connected to drain electrode of the other MOS transistor.

23. The semiconductor device of claim 20, wherein the selector comprises a switch connected between the two terminals of the-selector, the switch making the two terminals of the selector are electrically short-circuited or opened in response to the control signal.

24. The semiconductor device of claim 23, wherein the switch includes a MOS transistor gated with the control signal, source and drain electrodes of the MOS transistor being connected to the two terminals of the selector, respectively.

25. The semiconductor device of claim 20, wherein the control signal is a mode register set signal of which value varies depending on a mode of the semiconductor device.

26. The semiconductor device of claim 20, wherein each of the signature fuses provides a bypass to a predetermined number of the voltage reducing devices when the signature fuse is uncut.

27. An input circuit in a semiconductor device, comprising:
a plurality of input ports;
a plurality of input buffers each of which is connected to corresponding one of the plurality of input ports; and
a plurality of signature circuits connected in parallel between a voltage node and an input line formed between an input port and an input buffer,
wherein each of the plurality of signature circuits includes:
an selector for enabling or disabling the signature circuit in response to a control signal; and
an indexer connected with the selector in series between the input line and the voltage node, the indexer having a plurality of voltage reducing devices each being associated with a bypass fuse for determining a voltage drop of the indexer.

28. The input circuit of claim 27, wherein the plurality of signature circuits are enabled by the control signal in sequence and disabled in a normal mode of the semiconductor device.

29. An input circuit in a semiconductor device, comprising:
a plurality of input ports;
a plurality of input buffers each of which is connected to corresponding one of the plurality of input ports; and
a plurality of signature circuits connected in parallel between a voltage node and an input line formed between an input port and an input buffer,
wherein each of the plurality of signature circuits includes:
an selector for enabling or disabling the signature circuit in response to a control signal; and
an indexer connected with the selector in series between thee input line and the voltage node, the indexer having a plurality of resistance devices each being associated with a bypass fuse for determining an amount of current flowing the indexer.

30. The input circuit of claim 29, wherein the plurality of signature circuits are enabled by the control signal in sequence and disabled in a normal mode of the semiconductor device.

* * * * *